(12) United States Patent
Lin et al.

(10) Patent No.: US 8,594,857 B2
(45) Date of Patent: Nov. 26, 2013

(54) MODULIZED HEAT-DISSIPATION CONTROL METHOD FOR DATACENTER

(75) Inventors: Chih-Chien Lin, Taipei (TW); Chien-An Chen, Taipei (TW)

(73) Assignee: Inventec Corporation, Taipei (TW)

( * ) Notice: Subject to any disclaimer, the term of this patent is extended or adjusted under 35 U.S.C. 154(b) by 304 days.

(21) Appl. No.: 13/118,936

(22) Filed: May 31, 2011

(65) Prior Publication Data

US 2012/0136487 A1  May 31, 2012

(30) Foreign Application Priority Data

Nov. 26, 2010  (TW) .............................. 99141057 A

(51) Int. Cl.
*G05D 23/00* (2006.01)
*F28F 7/00* (2006.01)
*F28D 15/00* (2006.01)

(52) U.S. Cl.
USPC ........... 700/300; 700/277; 700/278; 700/299; 165/80.3; 165/80.4; 165/80.5; 165/104.13; 165/104.33; 361/679.46; 361/679.47

(58) Field of Classification Search
USPC .......... 700/276–278, 299–300; 713/300–320; 165/80.2–80.5, 104.11–104.13, 165/104.33; 361/679.46–679.47
See application file for complete search history.

(56) References Cited

U.S. PATENT DOCUMENTS

| | | | | |
|---|---|---|---|---|
| 8,437,129 | B2* | 5/2013 | Tung et al. | 361/679.47 |
| 2004/0264124 | A1* | 12/2004 | Patel et al. | 361/686 |
| 2009/0116332 | A1* | 5/2009 | Shu et al. | 366/144 |
| 2009/0268404 | A1* | 10/2009 | Chu et al. | 361/696 |
| 2010/0032142 | A1* | 2/2010 | Copeland et al. | 165/104.33 |
| 2011/0132579 | A1* | 6/2011 | Best et al. | 165/104.31 |
| 2011/0161712 | A1* | 6/2011 | Athalye et al. | 713/340 |
| 2011/0198057 | A1* | 8/2011 | Lange et al. | 165/104.26 |
| 2011/0198060 | A1* | 8/2011 | Lange et al. | 165/104.33 |
| 2012/0111533 | A1* | 5/2012 | Chen et al. | 165/80.2 |
| 2012/0113584 | A1* | 5/2012 | Chen | 361/679.47 |
| 2012/0113592 | A1* | 5/2012 | Chen | 361/695 |
| 2012/0127655 | A1* | 5/2012 | Tung et al. | 361/679.47 |

* cited by examiner

*Primary Examiner* — Ramesh Patel
(74) *Attorney, Agent, or Firm* — WPAT, PC; Justin King

(57) ABSTRACT

A modulized heat-dissipation control method for a datacenter is provided. In this method, a temperature sensor is used to sense inner temperatures of multiple servers and CPU temperatures in the multiple servers. If any one of the CPU temperatures is abnormal, a flow of a first coolant is adjusted. If any one of the inner temperatures is abnormal, a rotating speed of a fan module is adjusted. If the rotating speed of the fan module has reached its maximum, a flow of a second coolant is adjusted.

7 Claims, 3 Drawing Sheets

MODULIZED HEAT-DISSIPATION CONTROL METHOD FOR DATACENTER

BACKGROUND OF THE INVENTION

1. Field of Invention

The present invention relates to a modulized heat-dissipation control method for a datacenter, and in particular, to a method for simultaneously sensing inner temperatures of servers and central processing unit (CPU) temperatures in the servers, so as to control a rotating speed of a fan module or a flow of a coolant, and achieve an objective of modulized heat-dissipation control.

2. Related Art

With the development of a computer technology, computers, especially servers that are applied to the Internet and can perform a large amount of operations, have become indispensable in people's daily life.

In a current server disposing manner, multiple servers are disposed on a rack, each server is disposed with at least one CPU, and a side of the server is disposed with at least one fan. In a datacenter, an accommodation space is provided in a building or container to accommodate the multiple racks.

Since the CPU or a relevant electronic component used by the server is fast in operation and high in efficiency, relatively, an operating temperature generated by the CPU or electronic component during the operation is also very high, and a heat dissipation effect of the server is very important.

In a common server heat-dissipation manner, the server has a temperature sensor, which generally senses a CPU temperature and takes the sensed CPU temperature as a basis for controlling a rotating speed of the fan. Though different server manufactures have different control methods of the fan, generally, they all follow a principle of fastening the rotating speed of the fan when the CPU temperature rises. In addition, the servers on the rack drive the respective fans thereof to rotate according to their own sensed temperature values and determination formula. The fan blows air of the accommodation space to the server, so as to lower the server temperature. However, after flowing out of the server, the air after heat exchange returns to the accommodation space and raises the temperature in the accommodation space.

In order not to lower the heat dissipation efficiency, it is necessary to use an air conditioning equipment to lower a temperature of a vacant space. Though the air conditioning equipment may be controlled to adjust a load, it affects temperatures of the whole accommodation space. On the other side, it is difficult to even the temperatures of the whole accommodation space because of the disposing of the racks. Therefore, the temperatures of positions where the racks are located are also different, and it is difficult to control the loads of the fans on the servers.

In order to reduce power consumption of the datacenter for heat dissipation, and since it is difficult to perform better monitoring and control by adopting the conventional heat-dissipation control method, the inventor provides the present invention, so as to effectively monitor and lower heat dissipation cost of the datacenter with a modulized heat-dissipation control method.

SUMMARY OF THE INVENTION

Accordingly, the present invention is directed to a modulized heat-dissipation control method for a datacenter, so as to achieve an effect of modulized control.

The modulized heat-dissipation control method for a datacenter is used for a datacenter, and particularly for a container-type datacenter. The datacenter is disposed with multiple modulized racks. Each modulized rack is disposed with multiple servers. Each server is disposed with at least one node. Each node is disposed with at least one CPU. Each CPU thermally contacts with a water-cooled heat-exchange panel. All the water-cooled heat-exchange panels on the same rack are in communication with a first coolant loop. An inlet pipeline of the first coolant loop has a first solenoid valve, which may control a flow of a first coolant in the first coolant loop. The rack has a plurality of fan modules, and each fan module is disposed corresponding to several of the servers. An air inlet of the fan module has a fluid-air heat exchanger, which is in communication with a second coolant loop. An inlet pipeline of the second coolant loop has a second solenoid valve, which may control a flow of a second coolant of the second coolant loop.

In the modulized heat-dissipation control method for a datacenter, inner temperatures of all the servers and all CPU temperatures are sensed, and the sensed inner temperatures of the servers and the CPU temperatures are transferred to a heat-dissipation control system, in which the sensed temperatures are taken as a basis for adjusting a rotating speed of the fan modules, the flow of the first coolant, or the flow of the second coolant.

In order to achieve the objective, the present invention provides a modulized heat-dissipation control method for a datacenter, which comprises the following steps.

In step A, all the CPU temperatures in a rack are sensed, and the sensed temperatures are transferred to a heat-dissipation control system.

In step B, the heat-dissipation control system determines whether any one of the CPU temperatures is abnormal, and if yes, the flow of the first coolant is adjusted. The spirit of the present invention lies in adjusting the flow of the first coolant if any one of the CPU temperatures is abnormal. However, an actual practice may be, for example, it is determined whether any one of the CPU temperatures is higher than a set temperature value, and if yes, the flow of the first coolant is increased.

In step C, the inner temperatures of all the servers in a rack are sensed, and the sensed temperatures are transferred to the heat-dissipation control system.

In step D, the heat-dissipation control system determines whether any one of the inner temperatures of the servers is abnormal. If any one of the inner temperatures of the servers is higher than a second set temperature, the rotating speed of the fan module corresponding to the server is adjusted. If the rotating speed of the corresponding fan module has reached its maximum, the flow of the second coolant is adjusted. However, an actual practice may be, for example, it is determined whether any one of the inner temperatures of the servers is higher than another set temperature value, and if yes, the rotating speed of the fan module corresponding to the server is increased. If the rotating speed of the corresponding fan module has reached its maximum, the flow of the second coolant is increased.

In view of the above, the modulized heat-dissipation control method for a datacenter of the present invention may have the following advantages.

1. In the present invention, the fluid-air heat exchanger is mainly used to lower the temperature of the air sent by the fan module to the server, and simultaneously, a water-cooled heat-exchange panel is used to take heat generated by the CPU out of the accommodation space with the coolant, thus reducing an effect of the temperatures on an environment of the accommodation space where a machine table is located.

2. By adopting the heat-dissipation manner of the present invention, the heat dissipation of the machine table in the datacenter may be modulized, and the flows of the coolant are uniformly controlled by the coolant solenoid valves, which makes the present invention have convenience in an overall control.

3. Since the effect of the heat dissipation of air conditioning equipment on the accommodation space is lowered, the power consumption for heat dissipation may be lowered, purposes of energy saving and carbon emission reduction are achieved, and necessary expenditures is reduced.

4. The inner temperatures of the servers and the CPU temperatures are in the same environment, and thus they affect each other more or less, the heat-dissipation control system may respectively control the rotating speed of the fan, the flows of the first coolant and the second coolant, so as to respectively control the inner temperatures of the servers and the CPU temperatures, in which the inner temperatures of the servers and the CPU temperatures support each other.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The detailed description of the present invention is presented below with specific embodiments, and persons having ordinary skills in the technical art may easily understand other advantages and efficacies of the present invention according to the contents disclosed in the specification.

Figure 1:
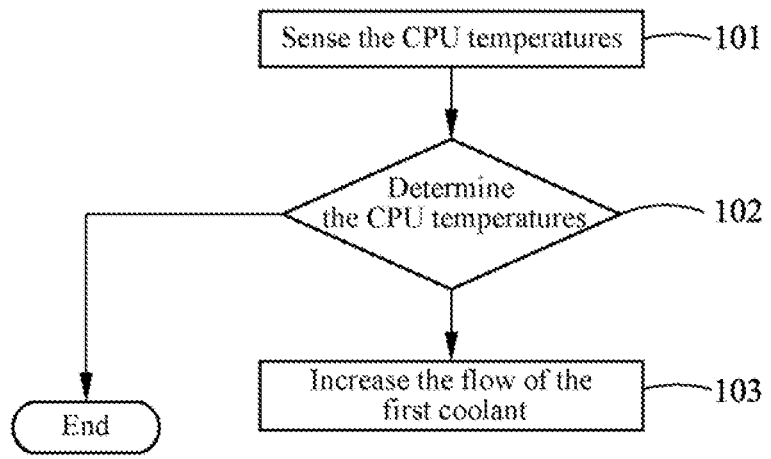
FIG. 1 is a flow chart of controlling CPU temperatures and a flow of a first coolant according to the present invention.
Figure 2:
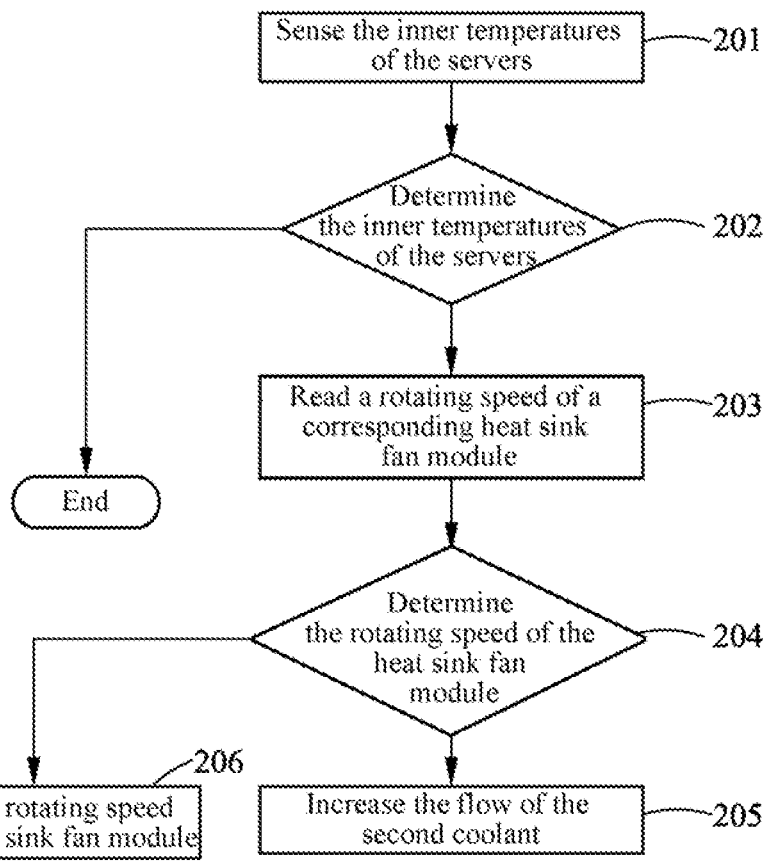
FIG. 2 is a flow chart of controlling inner temperatures, a fan module, and a flow of a second coolant according to the present invention.
Figure 3:
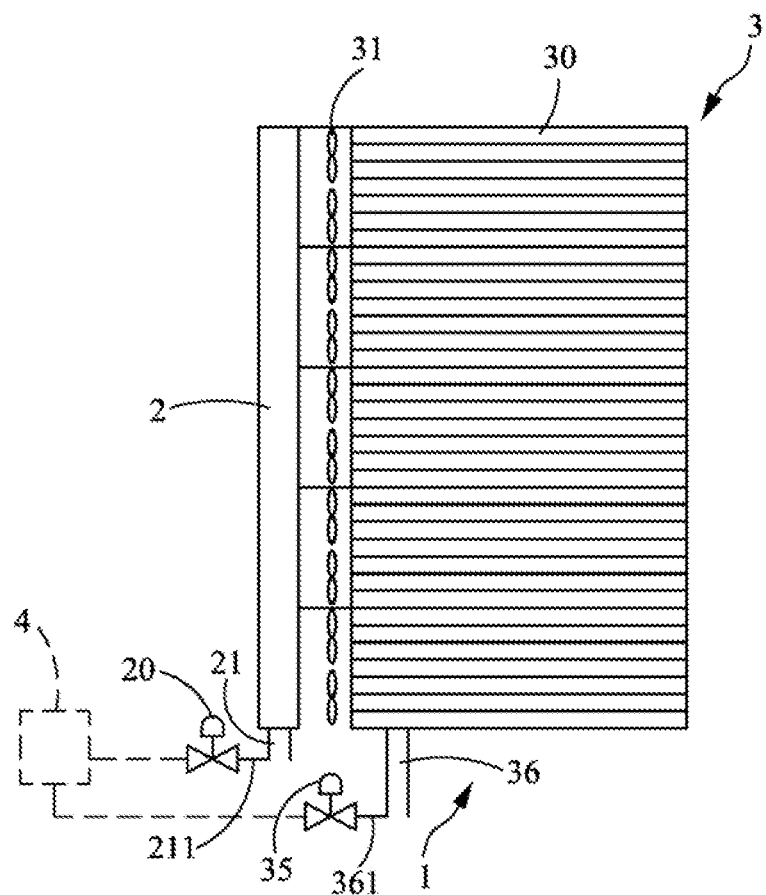
FIG. 3 is a schematic view of a machine table applying a modulized heat-dissipation control method for a datacenter according to the present invention.
Figure 4:
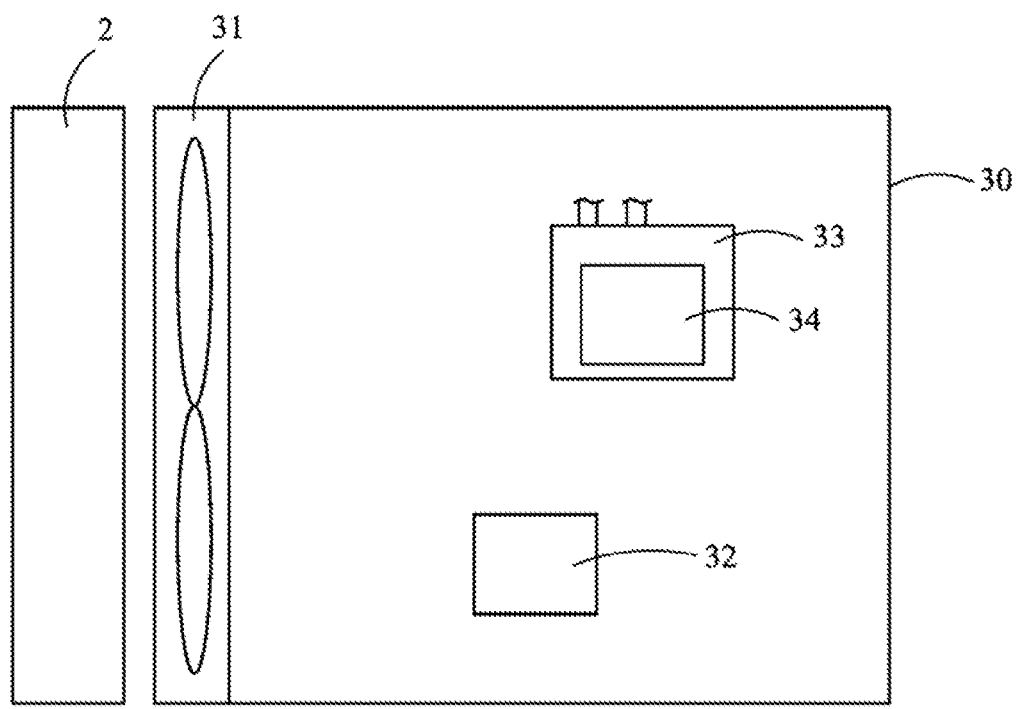
FIG. 4 is a schematic view of a server disposed in the machine table applying a modulized heat-dissipation control method for a datacenter according to the present invention.

Referring to FIG. 1 to FIG. 4, a modulized heat-dissipation control method for a datacenter of the present invention is used for a datacenter, and particularly for a container-type datacenter. The datacenter is disposed with multiple modulized racks 1. Each modulized rack 1 is disposed with multiple modulized servers 30. Each server 30 is disposed with at least one node. Each node is disposed with at least one CPU. Each CPU thermally contacts with a water-cooled heat-exchange panel 33. All the water-cooled heat-exchange panels 33 on the same rack 1 are in communication with a first coolant loop 36. An inlet pipeline 361 of the first coolant loop 36 has a first solenoid valve 35, which may control a flow of a first coolant in the first coolant loop 36. In this embodiment, every seven servers 30 are disposed with a corresponding fan module 31. An air inlet of the fan module 31 has a fluid-air heat exchanger 2, which is in communication with a second coolant loop 21. An inlet pipeline 211 of the second coolant loop 21 has a second solenoid valve 20, which may control a flow of a second coolant of the second coolant loop 21. In addition, each server 30 has a temperature sensor 32, and each CPU has a CPU temperature sensor 34. The temperature sensor 32 is used to sense an inner temperature of the server 30, and the CPU temperature sensor 34 is used to sense the CPU temperature.

The present invention provides a modulized heat-dissipation control method for a datacenter, which includes the following steps.

In Step 101, all the CPU temperatures in a rack 1 are sensed, and the sensed temperatures are transferred to a heat-dissipation control system 4. The heat-dissipation control system 4 controls the fan modules of all the racks of the whole datacenter and the flows of the coolants. The heat-dissipation control system 4 may be disposed in any one of the racks 1, or disposed independent to any one of the racks 1.

In Step 102, the heat-dissipation control system determines whether any one of the CPU temperatures is higher than a first set temperature, and if yes, Step 103 is performed; otherwise, no action is performed. The first set temperature is pre-set by a system administrator, and the heat-dissipation control system compares all the sensed CPU temperatures one by one so as to determine whether the CPU temperatures are higher than the first set temperature.

In Step 103, the flow of the first coolant is increased. The heat-dissipation control system 4 increases the flow of the first coolant through the first solenoid valve 35. The first coolant is used to pass through the water-cooled heat-exchange panel 33 that thermally contacts with the CPU, and to take away heat generated by the CPU. Therefore, larger flow of the first coolant may take more heat generated by the CPU away. In other words, the flow of the first coolant affects the CPU temperature.

In Step 201, the inner temperatures of all the servers 30 in a rack 1 are sensed, and the sensed temperatures are transferred to the heat-dissipation control system 4.

In Step 202, the heat-dissipation control system 4 determines whether any one of the inner temperatures of the servers is higher than a second set temperature, and if yes, Step 203 is performed; otherwise, no action is performed. The second set temperature is pre-set by the system administrator, and the heat-dissipation control system compares all the sensed inner temperature of the servers one by one so as to determine whether the inner temperatures of the servers are higher than the second set temperature.

In Step 203, a rotating speed value of the fan module 31 corresponding to the server 30 with the inner temperature higher than the second set temperature is read, and then Step 204 is performed.

In Step 204, it is determined whether the rotating speed value of the fan module 31 has reached its maximum, and if yes, Step 205 is performed; otherwise, Step 206 is performed.

In Step 206, the rotating speed of the fan module 31 is raised. The rotating speed of the fan module 31 affects the inner temperature of the server 30, and the inner temperature of the server 30 may be effectively lowered by raising the rotating speed of the fan module 31.

In Step 205, the flow of the second coolant is increased. The heat-dissipation control system 4 increases the flow of the second coolant through the second solenoid valve 20. The second coolant is used to pass through the fluid-air heat exchanger, and lower an air temperature at an inlet port of the fan module 31. The lower air temperature at the inlet port of the fan module 31 may reduce the inner temperature of the server 30 more effectively. Though the rotating speed of the fan module 31 is raised, the inner temperature of the server 30 still may be lowered. However, when this step is performed, the rotating speed of the fan module 31 has reached its maximum, that is, the rotating speed can no longer be raised to lower the inner temperature. Therefore, it is necessary to lower the air temperature at the inlet port of the fan module 31 by increasing the flow of the second coolant. In other words, the flow of the second coolant affects the air temperature at the inlet port of the fan module, and thus, the flow of the second coolant affects the inner temperature of the server.

In the modulized heat-dissipation control method for a datacenter, in each rack of the datacenter, the flow of the first coolant or the second coolant may be adjusted by means of a single first solenoid valve or second solenoid valve, so as to control the temperatures of the servers in the rack, such that a large amount of server temperature control devices in the original datacenter are simplified.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A modulized heat-dissipation control method for a datacenter, applied to a rack of a datacenter, wherein the rack has multiple servers, each server is disposed with at least one central processing unit (CPU), the rack has a plurality of fan modules, and each of the fan modules corresponds to several of the servers, the heat-dissipation control method comprising:

sensing all CPU temperatures in the rack;
determining whether any one of the CPU temperatures is abnormal, and if yes, adjusting a flow of a first coolant;
sensing inner temperatures of all the servers in the rack; and
determining whether any one of the inner temperatures of the servers is abnormal, and if yes, determining whether a rotating speed of a fan module corresponding to the server has reached its maximum, and if yes, adjusting a flow of a second coolant,
wherein the flow of the first coolant affects the CPU temperature, and the flow of the second coolant affects an air temperature at an inlet port of the fan module.

2. The modulized heat-dissipation control method for a datacenter according to claim 1, wherein the action of determining whether any one of the CPU temperatures is abnormal comprises determining whether the CPU temperatures are higher than a first set temperature; and the action of determining whether any one of the inner temperatures of the servers is abnormal comprises determining whether the inner temperatures of the servers are higher than a second set temperature.

3. The modulized heat-dissipation control method for a datacenter according to claim 1, wherein if any one of CPU temperatures is abnormal, the flow of the first coolant is increased; and if any one of the inner temperatures of the servers is abnormal, and the rotating speed of the fan module corresponding to the server has reached its maximum, the flow of the second coolant is increased.

4. The modulized heat-dissipation control method for a datacenter according to claim 1, wherein the actions of determining whether any one of the CPU temperatures is abnormal and determining whether any one of the inner temperatures of the servers is abnormal are performed by a heat-dissipation control system.

5. The modulized heat-dissipation control method for a datacenter according to claim 4, wherein the heat-dissipation control system adjusts the flow of the first coolant through a first solenoid valve, and the heat-dissipation control system adjusts the flow of the second coolant through a second solenoid valve.

6. The modulized heat-dissipation control method for a datacenter according to claim 1, wherein each CPU thermally contacts with a water-cooled heat-exchange panel, each water-cooled heat-exchange panel is in communication with a first coolant loop, and an inlet pipeline of the first coolant loop has a first solenoid valve capable of controlling the flow of the first coolant in the first coolant loop.

7. The modulized heat-dissipation control method for a datacenter according to claim 1, wherein an air inlet of the fan module has a fluid-air heat exchanger, the fluid-air heat exchanger is in communication with a second coolant loop, and an inlet pipeline of the second coolant loop has a second solenoid valve capable of controlling the flow of the second coolant in the second coolant loop.

* * * * *